United States Patent [19]

McGinniss

[11] 4,386,319
[45] May 31, 1983

[54] ESR ANALYSIS OF CONDUCTIVE VIDEO DISC COMPONENTS

[75] Inventor: Vincent D. McGinniss, Delaware, Ohio

[73] Assignee: RCA Corporation, New York, N.Y.

[21] Appl. No.: 250,618

[22] Filed: Apr. 3, 1981

[51] Int. Cl.$^3$ ............................................. G01R 33/08
[52] U.S. Cl. ..................................... 324/300; 324/316
[58] Field of Search ................................ 324/300, 316

[56] References Cited

U.S. PATENT DOCUMENTS 3,842,194  10/1974  Clemens ........................... 178/6.6 A
4,280,096   7/1981  Karthe ................................ 324/316

OTHER PUBLICATIONS

K. L. Brower, "EPR Techniques for Studying Defects in Silicon," Rev. of Sci. Inst., vol. 48, No. 2, Feb. 1977, pp. 135–141.

Primary Examiner—Michael J. Tokar
Attorney, Agent, or Firm—Birgit E. Morris; R. Hain Swope

[57] ABSTRACT

A method of accurately determining the degree of resin coating on the conductive particles in a conductive molding composition for a conductive, high density information disc at various stages in the manufacturing process as well as in the finished disc through the use of electron spin resonance techniques. The method is likewise useful in evaluating proposed changes in the formulation and processing parameters of the conductive molding composition.

4 Claims, No Drawings

ESR ANALYSIS OF CONDUCTIVE VIDEO DISC COMPONENTS

This invention relates to the use of electron spin resonance techniques to determine whether conductive video discs prepared from a conductive resin formulation will have acceptable playback performance.

BACKGROUND OF THE INVENTION

A capacitance video recording and playback system has been disclosed in Clemens U.S. Pat. No. 3,842,194, incorporated herein by reference. The disc described therein comprises a plastic disc containing an information track having audio, video and color information in the form of geometric variations in the disc surface. The geometric variations in said track correspond to capacitance variations representative of video signals which are picked up by a stylus riding along the track and converted into video information suitable for display by a television receiver. The video disc of Clemens had a conductive metal coating to provide the conductivity required for capacitive pickup and a thin layer of a dielectric material thereover. An electrode on the playback stylus completed the capacitor.

Improvements have been made in this system whereby the disc is molded from a conductive plastic composition, as disclosed by Fox et al. in copending application Ser. No. 105,550, filed Dec. 20, 1979, which is a continuation of application Ser. No. 818,279, filed July 25, 1977, now abandoned. This composition is prepared by blending a sufficient amount of finely particulate conductive particles, for example carbon black, with a plastic material, such as polyvinylchloride, so that the resulting composition has the conductivity required for capacitive playback. A thin layer of the plastic material surrounds each of the conductive particles thereby providing a thin dielectric layer on the surface of the molded disc.

The use of a conductive plastic composition of the type described by Fox et al. eliminates the need for separate metal and dielectric layers on the disc surface and thus has simplified manufacture of the disc. There is, however, the need to have the layer of resin covering the conductive particles be virtually a total covering since it has been found that loss of the dielectric layer at the surface of the molded disc is a major cause of playback defects of the finished video disc. A means of accurately determining whether the resin coating of conductive particles meets minimum product requirements would be of obvious economic benefit in a number of particulars.

First, if it were determined that a given batch of conductive particles dispersed in a resin would not meet product requirements, deterioration of costly stampers during molding of the discs therefrom would be prevented. Second, accurate measurement of the disc after molding to cull out those which would not meet minimum playback requirements would result in a savings in processing operations, packaging materials and the like. Finally, an accurate means of determining early in the manufacturing process whether video discs prepared from a given batch of formulation will meet minimum playback specifications with regard to resin coverage of the conductive particles is advantageous in reducing the number of discs which do not meet quality specifications. Such a determination is provided in accordance with this invention.

SUMMARY OF THE INVENTION

We have found that electron spin resonance analytical techniques can be utilized to accurately determine the degree of resin coating on the conductive particles in a molding composition for video discs at various stages in the manufacturing process as well as in the finished discs.

DETAILED DESCRIPTION OF THE INVENTION

The method of the present invention utilizes the analytical techniques of Electron Spin Resonance (hereinafter ESR). ESR, in essence, is a measurement in energy absorbed by a material placed at a point in space where two magnetic fields converge at right angles.

In an ESR apparatus, the two magnetic fields are very distinct. The first field is very powerful, i.e. a magnetic induction of several thousand gauss, unidirectional and constant in value. The second, at right angles to the first, is quite small, i.e. less than one gauss, and changes its direction at microwave frequencies. For certain chemical substances, the value of the constant field and the microwave frequency of the varying field will be in a fixed ratio and energy will be absorbed by the material from the microwave field. The distinct ESR signal obtained from this absorption provides information about the state of the molecules and atoms which make up the chemical substance.

In most instances, ESR analytical techniques are utilized to analyze chemical substances that contain unpaired electrons, i.e. free radicals, in their molecular structure. These free radicals exhibit a characteristic ESR absorption signal display. The intensity of the ESR signal is directly related to the concentration of free radicals contained in the sample. Information concerning the molecular and electronic environment or structural features of the free radical can be ascertained from the signals as well, i.e. by interpreting the distance, measured in gauss, between maximum and minimum peak heights.

Not only is it possible to clearly differentiate among chemical substances utilizing ESR techniques, it is likewise possible to obtain information concerning the processing history of a particular material. For example, the effect that certain processing steps such as heating or contact with certain solvents has on a particular material can be accurately determined through ESR techniques by contrast with the ESR signal of the untreated material. By the use of such determinations, useful information can be gathered regarding the surface environment of particulate conductive material during blending into a resin composition and processing of the composition into an article such as a video disc.

For example, a sample of commercially available carbon black produces a broad, flat ESR signal of 100–120 gauss maximum to minimum peak distance. If this material is subjected to moisture, the ESR signal flattens out completely with no maximum or minimum peak. Drying the material returns the distance between peaks to about 100–120 gauss, but the peak amplitude becomes more intense. Nitrogen gas sparging of the same material narrows the ESR signal to about 45 gauss. Treatment with various solvents has a similar effect.

The sensitivity of particulate materials such as carbon blacks to oxygen is likewise an important parameter measured by ESR techniques. If oxygen is present, the ESR signal for a given material will broaden. This effect is both rapid and reversible indicating that oxygen is only adsorbed on the surface of the material. Vacuum treatment of such material or exposure to certain organic solvents such as, e.g. hexane, carbon tetrachloride, acetone, toluene and the like, predictably causes the signal to narrow through removal or displacement of the oxygen on the surface of the material. The exact mechanism or mechanisms responsible for these phenomena are not known with certainty.

Through the use of ESR techniques, therefore, it is possible to determine whether the conductive particles, e.g. carbon black, in a conductive video disc formulation such as described by Fox et al. in copending application Ser. No. 105,550, are completely coated by the resin. Such determinations may be made at any point or points in the manufacture of the video disc or on the finished disc itself.

In accordance with this invention, an intrinsic ESR value must be established for any conductive particulate material for comparative purposes. The intrinsic ESR value for a given conductive particulate material is defined as the ESR signal for that material with substantially no oxygen on its surface. This value can be obtained by measuring the material under conditions which substantially eliminate any oxygen from the material surface, i.e. placing the material under vacuum or totally immersing it in certain solvents such as hexane.

It has been found, in accordance with this invention, that when a given set of formulation parameters causes complete coverage of the conductive particles, the ESR value of that formulation should be equal to the intrinsic value of the conductive particles themselves. Likewise, the ESR values obtained at any stage in the mixing and processing of such a formulation, or on the finished discs, are an indication of the degree of coverage of the conductive particles by the resin at that point in time. It is usually preferable to carry out more than one ESR determining during the process of manufacturing video discs. When more than one such determination is carried out, it is preferred that such multiple determinations include the conductive composition, the finished video disc or both. Any number of determinations may be carried out in the process up to the maximum number possible for each formulation change and/or processing step, e.g. pelletizing.

In general, a molding composition such as described by Fox et al. can be formulated by a number of methods. For example, the conductive particles can be added to the other molding composition ingredients prior to blending, to the blending composition in molten form or preblended with certain other ingredients. Apparatus such as a Banbury mixer and a Brabender apparatus or a twin-screw extruder can be employed to mix the plastic composition and the conductive particles.

The filled molded composition is then pelletized. Pelletizing can be carried out, for example, as the composition is discharged from the extruder or by sheeting the composition on a two-roll mill and subdividing the sheets. The pellets may be further processed immediately or stored for later processing, i.e. molding.

Preferably, the pellets are initially compression molded into a preform from which the video discs are made. The preform has a shape consistent with the pressing of video discs. Generally, preforms have the configuration of a thick disc of smaller dimension than the video disc and have convex upper and lower surfaces. As is the case with the pellets, the preforms, commonly referred to as "pucks" may be immediately made into video discs or may be stored for manufacture of video discs at a future time.

The preforms or "pucks" are made into video discs by compression molding utilizing metal stampers such as described by Clemens. As previously stated, it is within the scope of this invention to utilize ESR techniques at any one or more points in the manufacturing process, e.g. at one or more stages of blending, on the pellets, on the preform, or on the finished disc. Each such ESR reading is then compared to the intrinsic ESR value for the conductive particles to determine the degree of resin coating on the conductive particles.

An additional advantage of the use of ESR techniques in accordance with the present invention is that, by comparison of ESR signals, various additives to and changes in formulation design can be accurately evaluated in terms of their influence on resin coverage of the conductive particles. Utilizing ESR techniques in accordance with this invention, it can be ascertained which among a group of substances having similar composition and utility in formulation design would be most advantageous in terms of its influence on resin coverage of the conductive particles. For example, in an evaluation of stearic acid and its inorganic salts, it was observed that replacing calcium stearate with zinc stearate in identical formulations produced a significant reduction in ESR signal, thus indicating that zinc stearate possesses the greatest positive influence on particle coverage by the resin. ESR techniques may likewise be utilized to evaluate variations in processing operations such as, for example, order of mixing of ingredients, type of mixing, application of heat and the like for their effect on particle coverage.

The formulation described in the aforementioned Fox et al. application is a very complex one. The resin component can be, for example, polyvinyl chloride, polyvinyl chloride copolymers and terpolymers with polyvinyl acetate, propylene and the like, polyethylene-polypropylene copolymers, acrylic polymers and the like. The resin is combined in the formulation with conductive particles such as, for example, carbon black, as well as with various other ingredients such as stabilizers, lubricants, processing aids and the like. This complex formulation is blended, pelletized and compression molded into discs from a metal video disc master as described by Clemens in U.S. Pat. No. 3,842,194.

During the blending, processing and compression of video discs from the above-described formulations, there is a series of complex carbon/formulation/processing interactions and reactions that occur. These reactions are not solely first generation, i.e. the product of a given reaction may itself react with something else in its environment, e.g. a component, another product, etc. The exact nature of many of these reactions is not known. It is known, however, that they can cause microdefects in the finished video disc. It is believed that these reactions and whatever they take out and/or add to the formulation during processing have a definite influence on the resin coating of the conductive particles. That such is clearly the case is evident from the fact that there is a direct correlation between ESR signals, which is an indication of the degree of resin coverage of the conductive particles, and the number of microdefects in the finished video disc.

As stated above, the ESR signals for a given type conductive particle, e.g. carbon black, may in large measure arise from free radicals on the surface of the particles. The signal may also arise from unpaired electrons trapped in large aromatic type compounds condensed on the surface of the particles or surface entrapped metallic impurities having paramagnetic centers, e.g. $V^{+2}$, $Cr^{+3}$, $Ni^{+2}$, $Cu^{+2}$ and the like. Regardless of the source or sources of fluctuations in the ESR signal, the magnitude thereof is directly related to surface area of the conductive particles not covered by the resin.

The presence of partially coated conductive particles on the surface of a video disc will have a deleterious effect on playback, i.e. a microdefect, through at least two mechanisms. First, the absence of a sufficient dielectric layer on the surface of the disc distorts the signal being picked up by the stylus. Second, substances present in the formulation or in the environment, i.e. moisture, may become adsorbed onto the exposed surface of the conductive particles and interfere with the signal pickup, the mechanical passage of the stylus or both. Microdefects, therefore, are evident both as electrical problems such as distortion or interruption of signal and mechanical problems involving movement of the stylus such as lock groove, skating, skipping, and the like. Through the analytical techniques of this invention, the number of video discs which would exceed acceptance specifications relating to the number of such microdefects may be substantially reduced.

The following examples further illustrate this invention, it being understood that the invention is in no way intended to be limited to the details described therein. In the examples, all temperatures are in degrees Centigrade unless otherwise stated.

EXAMPLE 1

A sample of carbon black available from the Cabot Corporation was analyzed in a conventional ESR spectrometer, the Bruker 200-D-A3 manufactured by Bruker Instrument Co., Billerica, Mass. Samples of the same material were immersed in various solvents and analyzed to determine the effect thereof. The results are reported in Table I.

TABLE I

| Solvent | ESR Signal |
|---|---|
| None | 100–120G |
| Carbon Tetrachloride | 54G |
| Tetrahydrofuran | 40G |
| Petroleum Ether | 34G |
| Acetone | 36G |
| Toluene (Room Temperature) | 40G |
| Toluene (100°) | 70–80G |
| Styrene (Room Temperature) | 34G |
| Styrene (100°) | 56G |

The effect of the various solvents through removal of oxygen is clearly evident from the foregoing data. The ESR signal in each instance is the distance between maximum and minimum peaks.

EXAMPLE 2

A series of carbon blacks was analyzed by ESR techniques first in air and then either immersed in hexane or under vacuum. The results are given in Table II.

TABLE II

| | ESR Width (Gauss) | |
|---|---|---|
| Sample No. | Air | Hexane or Vacuum |
| 1 | 80 | 9–11 |
| 2 | 100–120 | 35 |
| 3 | 180 | 30 |
| 4 | 160 | 19 |
| 5 | 200 | 19 |
| 6 | 180 | 24 |
| 7 | 170 | 21 |
| 8 | 180 | 23 |
| 9 | 160 | 17 |
| 10 | 120 | 18 |
| 11 | 120 | 26 |
| 12 | 130 | 23 |
| 13 | 130 | 21 |

The ESR readings in hexane or under vacuum demonstrate the effect of removal of oxygen from the carbon surface and represents the intrinsic ESR signal of each material. It was found that, with a given carbon black, the intrinsic ESR signal was, in essence, the same regardless of whether the determination was made in hexane or under vacuum.

EXAMPLE 3

In order to demonstrate the direct relationship between the ESR signal and microdefects in the finished video disc, a series of molding compositions was prepared by the following procedure.

The following ingredients were blended in a Henschel mixer: 74 parts of a vinylchloride-polypropylene copolymer, AP-480 of B. F. Goodrich Company; 15 parts Ketjenblack EC carbon particles (AKZO Chemie); 0.5 part Loxiol G-30 lubricant of Henkel International GmbH; 0.25 part Loxiol G-70 lubricant; 0.3 part calcium stearate lubricant; 2 parts Acryloid k-175, a commercially available acrylic processing aid of Rohm and Hass Company; 1.5 parts dibutyltin-$\beta$-mercaptopropionate stabilizer commercially available as T-35 from M&T Chemical Company; 1.0 part dibutyltin maleate stabilizer, a liquid, and 1.0 part barium-lead stabilizer, commercially available from Argus Chemical Company as Mark 275 and Mark Q 232B, respectively; 1.0 part of an epoxidized soybean oil, Paraplex G-62, a liquid plasticizer commercially available from Rohm and Haas Company; 0.4 part Wax E, an esterified montan wax lubricant, commercially available from the Hoechst Company; 1.0 part glyceryl tribenzoate, commercially available as Benzoflex S404 from Velsicol Chemical Corporation, a solid plasticizer; and 2.0 parts of a chlorinated paraffin wax, commercially available as Unichlor 70AX from Neville Chemical Company, a solid modifier.

Mixing was continued until the temperatures reached about 190° F. The mixture was cooled and fed to a plasticating extruder to form a pelletized compound. Preform "pucks" were prepared from the pellets by compression molding at 180°–190° F. Video discs 12 inches in diameter were compression molded from the preforms at 350° F. using a 36 second cycle with a metal stamper described by Clemens in U.S. Pat. No. 3,842,194, referred to hereinabove.

The above formulation was modified by the replacement of the above-named carbon black with a series of carbon blacks available from the Cabot Corporation. Slight variances in proportion were made in the formulation where necessary. In each instance the intrinsic ESR signal of the carbon black before formulating and of the finished video disc were obtained.

The average number of microdefects for video discs prepared from each carbon black formulation was determined electronically

TABLE III

| Carbon Black | Intrinsic ESR Signal | ESR Signal for Each Disc | Average No. Microdefects |
|---|---|---|---|
| Ketjenblack EC | 9–11G | 9G | 13 |
| CSX-150G | 21G | 21G | 28 |
| CSX-150F | 22G | 22G | 35 |
| CSX-150H | 23G | 23.5G | 36 |
| CSX-150E | 19G | 22G | 45 |
| CSX-150C | 30G | 34.5G | 58 |
| CSX-150D | 19G | 25.5G | 67 |
| CSX-150A | 35G | 45G | 122 |

The ESR signal for the disc prepared from the Ketjenblack formulation indicates complete coverage of the carbon black particles. On the other hand, Cabot carbon blacks CSX-150E,C,D, and A showed a difference in ESR signal between intrinsic signal and video disc of 3, 4.5, 5.5, and 10, respectively. This indicates that complete surface coverage of the carbon was not obtained with these formulations under normal processing conditions. As is evident from the table, a high level of microdefects resulted in the finished discs prepared from these formulations, particularly carbon black CSX-150A.

EXAMPLE 4

Video discs were prepared from the following general formulations with variations in proportion for the carbon black used:

| Ingredient | Parts by Weight |
|---|---|
| Carbon black | 13–15 |
| Stabilizer: T35 (tin mercaptide) Mark 275 (tin maleate) | 0.9–2.1 |
| Long chain esters of stearic acid (Henkel Chemical Co.) | 0.9–2.1 |
| Long chain esters of phthalic anhydride (Argus Chemical Co.) | 0.35–0.65 |
| Diundecylphthalate (Monsanto) | 1–3 |
| Acrylic resin processing aids K-174 and K-175 (Rohm & Haas Co.) | 1.5–4.0 |
| Polyvinyl chloride | 72–78 |

ESR signals were obtained at various stages in the preparation of the discs. As a further indication of the use of ESR techniques to monitor processing conditions, samples of identical formulations were blended in a Brabender blender beyond usual mixing times. The results of these experiments are reported in Table IV. In Table IV, formulation A is Ketjenblack, which has an ESR signal of 80G and an intrinsic signal of 9–11G, and formulation B is a Cabot carbon black CSX-150A which has an ESR signal of 120G and an intrinsic signal of 35G. The results are reported in Table IV.

TABLE IV

| Processing Step Completed | ESR Signal |
|---|---|
| Dry blending | A 18–24G |
| | B 65–100G |
| Pelletizing | A 10G |
| | B 45–50G |
| Compression into a Preform | A 7–11G |
| | B 40G |

TABLE IV-continued

| Processing Step Completed | ESR Signal |
|---|---|
| Compression into Video Disc | A 8–9G |
| | B 45G |
| Brabender Processing | |
| Dry blending | A 24G |
| | B 100G |
| Fusion* | A 14G |
| | B 40G |
| Degradation** | A 21G |
| | B 40G |

*Continued mixing until formulation viscosity increases or formulation association melting occurs (4–5 minutes).
**Continued mixing until there is an increase in viscosity over normal minimum formulation processing viscosity conditions (13–40 minutes).

The experiments reported in this example demonstrate that, in accordance with this invention, parameters can be established at any point in the preparation of video discs to utilize ESR techniques in determining resin coverage of conductive particles such as carbon black.

EXAMPLE 5

In order to demonstrate the use of ESR techniques to determine the relative effectiveness of various candidates for inclusion in a video disc formulation, the formulation of Example 3 containing Cabot carbon black CSX-150A was modified only to replace calcium stearate with a comparable quantity of stearic acid or another inorganic stearate. The calcium stearate-containing formula, which demonstrated high microdefect levels, was used as a control. The results are reported in Table V.

TABLE V

| Variable Component | ESR Signal of Disc |
|---|---|
| Calcium stearate (control) | 40–45G |
| Sodium stearate | 35G |
| Stearic acid | 34G |
| Zinc stearate | 30G |

The advantage of ESR techniques in evaluation formulation modification are clearly demonstrated by marked reduction in ESR signal achieved by replacing calcium stearate with zinc stearate.

I claim:

1. In a process of manufacturing a conductive, high density information disc containing both video and audio information comprising dispersing conductive particles in a plastic material, said plastic material substantially covering each of said particles, and compression molding the resulting conductive composition into said disc, the improvement comprising determining the extent to which said particles are covered by said plastic material by obtaining an electron spin resonance signal for said information disc or said composition and comparing said signal with the intrinsic electron spin resonance signal for said conductive particles.

2. A process in accordance with claim 1, wherein more than one electron spin resonance determination is carried out during said process.

3. A process in accordance with claim 2, wherein one of said determinations is carried out on said information disc.

4. A process in accordance with claim 2, wherein one of said determinations is carried out on said conductive composition.

* * * * *